(12) United States Patent  (10) Patent No.: US 7,215,158 B2
Kitagawa et al.  (45) Date of Patent: May 8, 2007

(54) COMPARATOR SWITCHING APPARATUS AND METHOD

(75) Inventors: Masahiro Kitagawa, Nukata-gun (JP); Katsuhito Takeuchi, Toyokawa (JP); Hiroyuki Obata, Nukata-gun (JP)

(73) Assignee: Denso Corporation, Kariya (JP)

( * ) Notice: Subject to any disclaimer, the term of this patent is extended or adjusted under 35 U.S.C. 154(b) by 47 days.

(21) Appl. No.: 11/239,083

(22) Filed: Sep. 30, 2005

(65) Prior Publication Data
US 2006/0119401 A1    Jun. 8, 2006

(30) Foreign Application Priority Data
Oct. 4, 2004   (JP)   ............... 2004-291769

(51) Int. Cl.
H03K 5/22    (2006.01)
H03K 5/153   (2006.01)

(52) U.S. Cl. .......................................... 327/63; 327/74
(58) Field of Classification Search ............... 327/63, 327/70, 74–76
See application file for complete search history.

(56) References Cited
U.S. PATENT DOCUMENTS 5,436,582 A * 7/1995 Ikeda ........................ 327/65
5,539,340 A * 7/1996 Van Leeuwen et al. ........ 327/74
5,933,459 A * 8/1999 Saunders et al. ............ 375/317
6,407,591 B1 * 6/2002 Wong et al. ................. 327/63
6,873,193 B2 * 3/2005 Kinoshita et al. ........... 327/143

FOREIGN PATENT DOCUMENTS
JP    A-7-64680    3/1995

* cited by examiner

Primary Examiner—Quan Tra
Assistant Examiner—Rey Aranda
(74) Attorney, Agent, or Firm—Posz Law Group, PLC (57) ABSTRACT

An operation switching circuit switches over two comparators, which receives communication data, in accordance with a normal mode and a standby mode of a microcomputer. A delay circuit delays a mode switching signal. The mode switching signal and the delayed signal are combined by an OR gate and an AND gate to two comparator control signals, which have different high level periods. The comparators are driven by the comparator control signals, while a multiplexer is driven by the delayed signal. When one comparator is switched from the inoperative state to the operative state, the other comparator is continued to be held operative for the delay period before being switched to the inoperative state.

5 Claims, 6 Drawing Sheets

COMPARATOR SWITCHING APPARATUS AND METHOD

CROSS REFERENCE TO RELATED APPLICATION

This application is based on and incorporates herein by reference Japanese patent application No. 2004-291769 filed on Oct. 4, 2004.

FIELD OF THE INVENTION

The present invention relates to a comparator switching apparatus and a method for switching over two comparators, which have respective operation characteristics different from each other in correspondence with two operation modes, to be selectively operable in response to changes in a mode switching signal.

BACKGROUND OF THE INVENTION

An electronic control unit (ECU) for controlling a vehicle by CAN that is one of in-vehicle local area networks (LAN) is constructed to be selectively operable in a standby mode for low power consumption and a normal mode. Communication data are transmitted through a bus and compared with a threshold by a comparator.

Even in the standby mode, when the ECU receives data transmitted from another ECU or the like in the vehicle, the ECU is switched to the normal mode (wake-up operation) in response to the reception of such data. The comparator therefore needs be held operable.

The comparator necessarily consumes electricity if held operable even in the standby mode. The comparator in the standby mode is only required to output a trigger for switching the ECU to the normal mode when the data is received. The comparator thus need not have a quick response characteristic.

It is proposed to provide for the standby mode another comparator, which is a low power consumption and slow response characteristic, in addition to the comparator for the normal mode. The two comparators are switched over to be selectively operable in such a manner that the power consumption in the standby mode is reduced.

Figure 6:
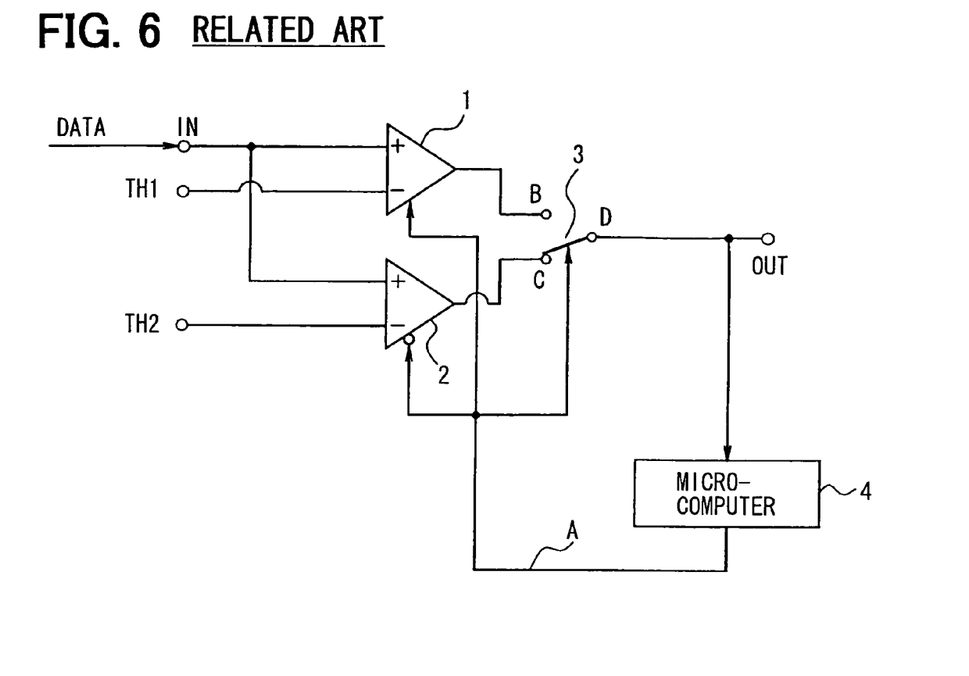
FIG. 6 is a circuit diagram of a comparator switching apparatus according to a related art.

FIG. 6 schematically shows a proposed arrangement of two comparators 1 and 2. The comparators 1 and 2 are for a normal operation and a standby operation, respectively. Each comparator 1, 2 receives data at a non-inverting input terminal (IN) and compares it with a threshold TH1, TH2 thereby to output either a high or low level signal. Each output terminal B, C is connected to an input port of a microcomputer 4 through a multiplexer (MPX) 3. The microcomputer 4 is constructed to receive data through the comparator 1 in the normal mode for communication with other devices through an in-vehicle LAN. The thresholds TH1 and TH2 may be set to the same levels or different levels. The threshold TH2 is preferably set to be lower than the threshold TH1, because the comparator 2 is a slow response type.

The microcomputer 4 outputs a mode switching signal A to select either one of the comparators 1 and 2 as an operating comparator and select either one of the output signals by the multiplexer 3 as an output D of the multiplexer 3. For instance, the microcomputer 4 sets the mode switching signal A to a low level for the standby mode operation as shown by (A) of FIG. 7, so that only the comparator 2 is held operable as shown by (C) of FIG. 7 and the multiplexer 3 selects the output terminal C, that is, the output signal of the comparator 2 as shown by (D) of FIG. 7. The microcomputer 4 sets the mode switching signal A to a high level for the normal mode operation as shown by (A) of FIG. 7, so that only the comparator 1 is held operable as shown in (B) of FIG. 7 and the multiplexer 3 selects the output terminal B, that is, the output signal of the comparator 1 as shown by (D) of FIG. 7.

In the above proposed arrangement, when the comparator 2 receives data in the standby mode, it outputs the received data to the microcomputer 4. The microcomputer 4 wakes up from the standby mode and changes the mode switching signal to the high level. The comparator 1 responsively becomes operable and the multiplexer 3 selects the output signal of the terminal C.

Figure 7:
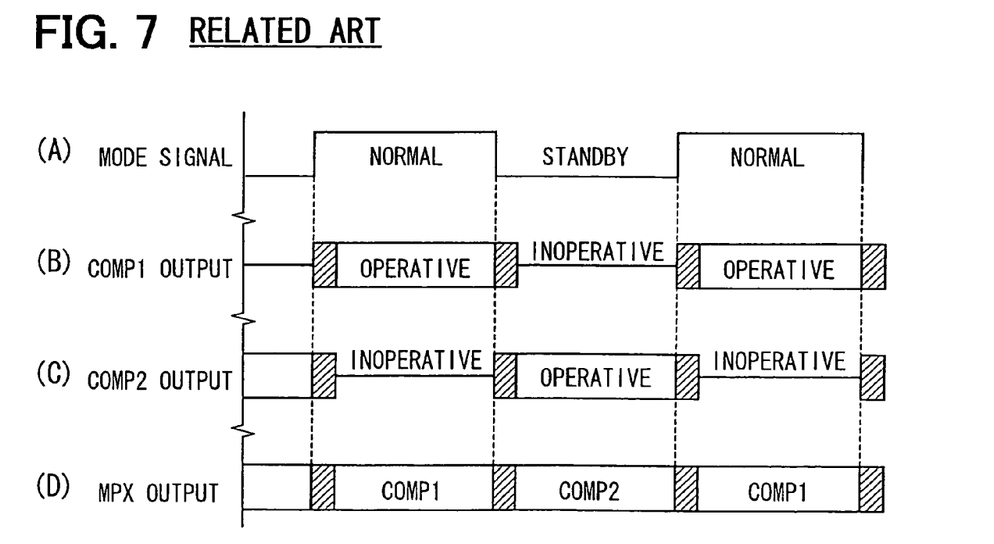
FIG. 7 is a timing diagram showing an operation of the related art.

When the comparators 1 and 2 change its state between the operable state and the inoperable state, the output signal levels of the comparators 1 and 2 become unstable for a short period of time as shown by hatching FIG. 7. This period of instability of the comparator 2, which is a low power consumption type, tends to become longer than that of the comparator 1. As a result, the microcomputer 4 may receive inappropriate signal in this period and operate erroneously.

SUMMARY OF THE INVENTION

It is therefore an object of the present invention to provide a comparator switching apparatus and method that prevents unstable output signals of comparators from being applied to an outside device when operating states of the comparators are switched over in accordance with operation modes of the outside device.

According to the present invention, first and second comparators are switched over in accordance with two different modes of a microcomputer, for instance a normal mode and a standby mode. The comparators have respective operation characteristics different from each other in respect of the two different modes. A mode switching signal generated from the microcomputer at a time of switching between the different modes is delayed for a predetermined period longer than periods in which the first comparator and the second comparator operate unstably between an inoperative state and an operative state. The first comparator is started to switch from the inoperative state to the operative state in response to the mode switching signal. The second comparator is started to switch from the operative state to the inoperative state in response to the delayed signal of the mode switching signal. A first output signal of the first comparator is applied to the microcomputer only after the predetermined period. A second output signal of the second comparator is continued to be applied to the microcomputer for the predetermined period from the mode switching signal.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF EMBODIMENTS

The present invention will be described in detail with reference to various embodiments. Throughout the embodiments, the same or like parts are designated with the same or like reference numerals as in the comparator switching apparatus of the related art shown in FIG. 6 for brevity of description.

(First Embodiment)

Figure 1:
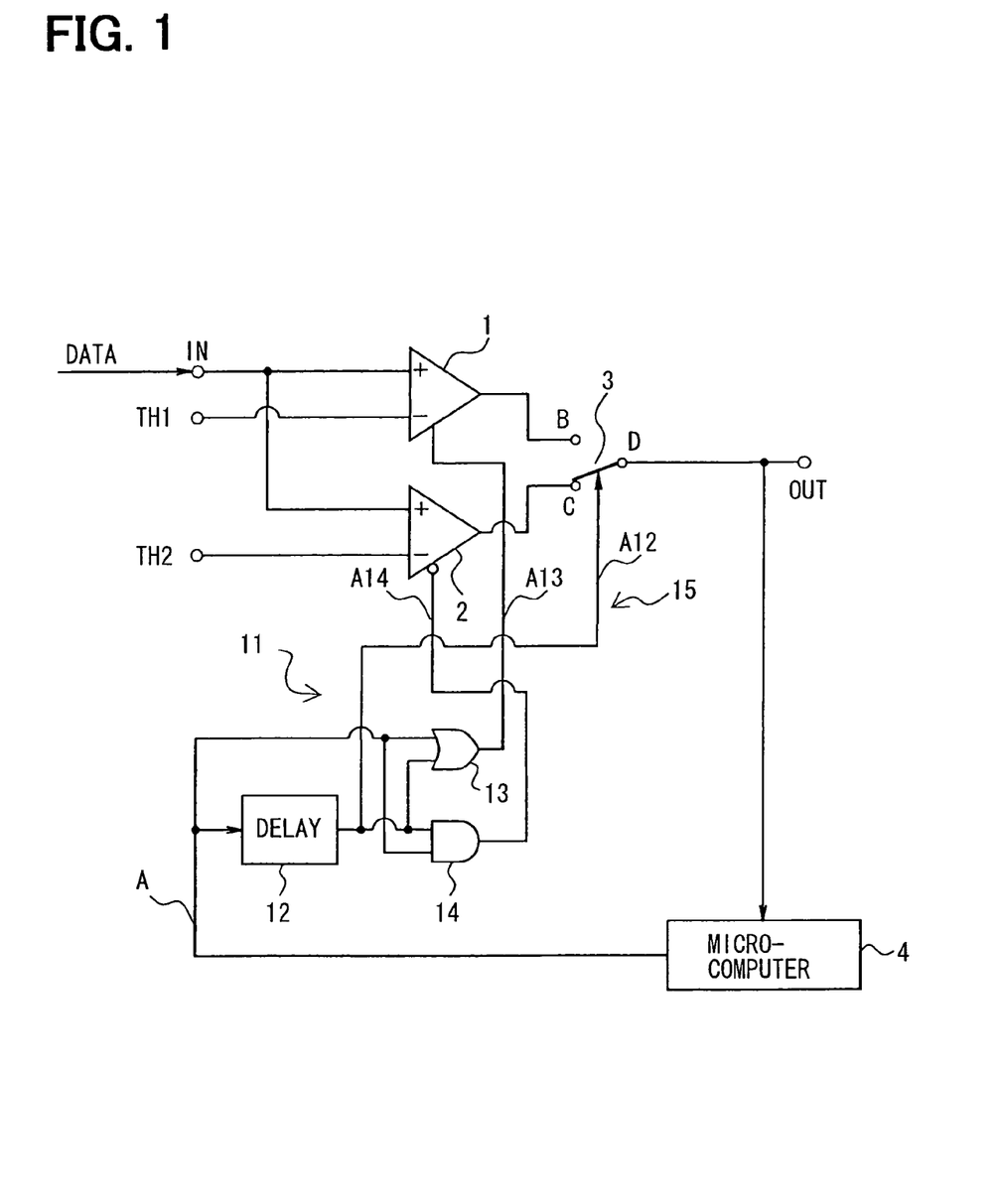
FIG. 1 is a circuit diagram of a comparator switching apparatus according to a first embodiment of the present invention.

In this embodiment, a first comparator 1 for a normal mode operation and a second comparator 2 for a standby mode are connected to a comparator switching apparatus 15. The switching circuit 15 includes a multiplexer 3 and an operation switching circuit 11. The switching circuit 11 is connected to receive a switching signal A from a microcomputer 4. The switching circuit 11 is constructed with a delay circuit 12, an OR gate 13 and an AND gate 14 to produce and apply switching control signals A12, A13 and A14 to a multiplexer 3 and comparators 1, 2, respectively.

The delay circuit 12 is constructed with an even number of series-connected NOT gates (not shown) or a delay line (not shown). The delay circuit 12 delays the mode switching signal A by a predetermined period Td and applies the delayed signal as the switching control signal A12 for the multiplexer 3. The delay period Td provided by the delay circuit 12 is determined in consideration of the operation characteristic of the comparator 2. It may usually be set to be between several microseconds (μs) and about 100 microseconds in which the comparator will completes its transition between the operative state and the inoperative state. This delayed signal A12 is also applied to the gates 13 and 14 together with the mode switching signal A.

The output signal of the OR gate 13 is applied to the operation control terminal (non-inverting logic) of the comparator 1 as the control signal A13 for the comparator 1. The output signal of the AND gate 14 is applied to the operation control terminal (inverting logic) of the comparator 2 as the control signal for the comparator 2.

When the microcomputer 4 is in the standby mode (low power consumption mode), it stops producing operating clock signals for instance and hence consumes less electric power than in the normal operation mode. In this standby mode, the comparator 2 is operative while the comparator 1 is not. When the microcomputer 4 receives the first data through the comparator 2 at time t1, it becomes operative in the normal mode and changes its mode switching signal A to a high level as shown in (A) of FIG. 2.

Figure 2:
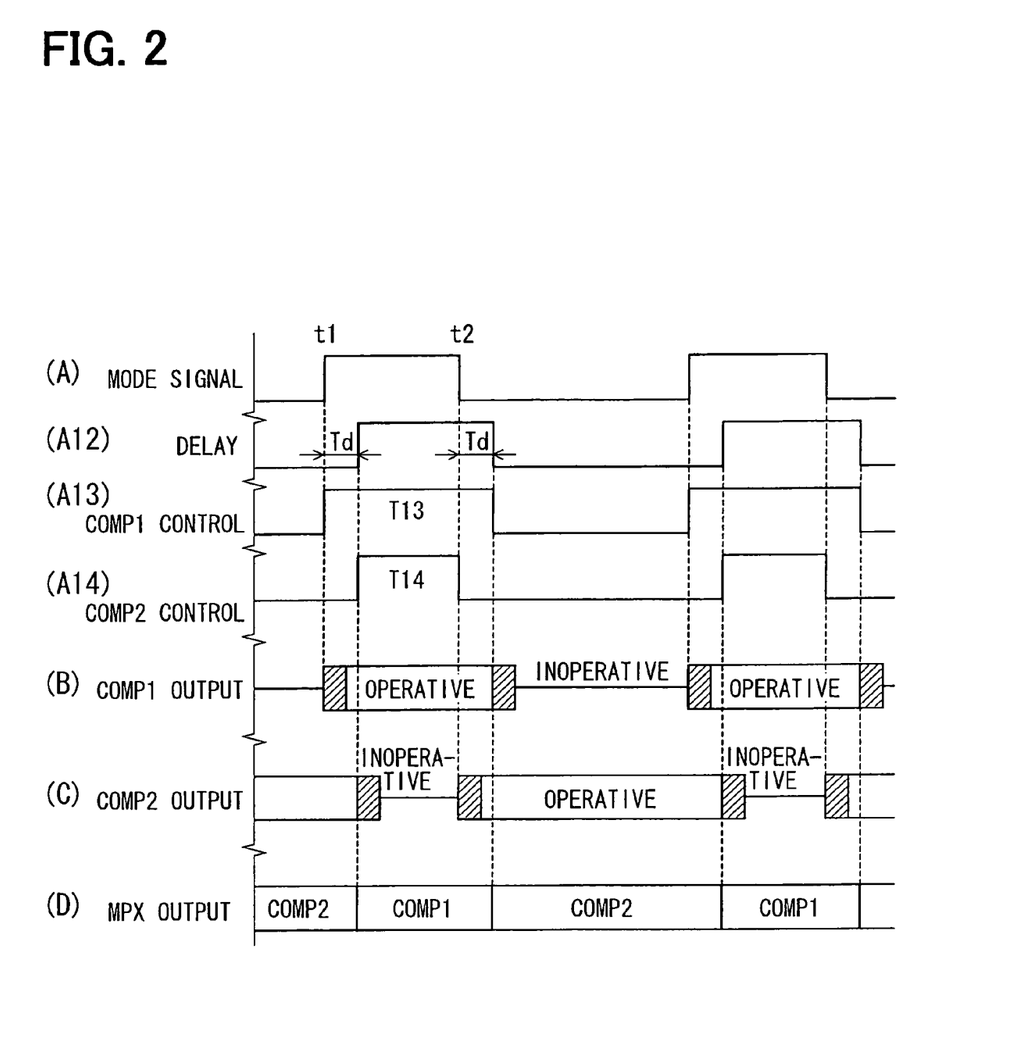
FIG. 2 is a timing diagram showing an operation of the first embodiment.

The delay circuit 12 delays this switching signal A as shown in (A12) of FIG. 2. The OR gate 13 subjects the switching signal A and the delayed signal A12 to the OR-logic operation and produces the control signal A13 for the comparator 1 as shown in (A13) of FIG. 2. This control signal A13 has a high level period T13 longer than that of the mode switching signal A. The AND gate 14 subjects the switching signal A and the delayed signal A12 to the AND-logic operation and produces the control signal A14 for the comparator 14 as shown in (Al4) of FIG. 2. This control signal A14 has a high level period T14 shorter than that of the mode switching signal A.

Since the control signal A13 rises substantially at the same time as the mode switching signal A, a power supply to the comparator 1 is started at this signal rise time so that the comparator 1 starts to switch its condition from the inoperative state to the operative state as shown in (B) of FIG. 2. During this transition, as indicated with hatching in FIG. 2, the output signal level of the comparator 1 momentarily becomes unstable. However, the comparator 1 completes its transition during the delay period Td provided by the delay circuit 12, the output signal level becomes stable and is fixed.

Since the control signal A14 rises substantially at the same time as the delayed signal A12, a stop of power supply to the comparator 2 is started at this signal rise time so that the comparator 2 starts to switch its condition from the operative state to the inoperative state as shown in (C) of FIG. 2. During this transition, as also indicated with hatching in FIG. 2, the output signal level of the comparator 2 momentarily becomes unstable. At this transition, the output signal level of the comparator 1 is already fixed and stable as understood from (B) of FIG. 2.

Therefore, when the multiplexer 3 is switched from the terminal C to the terminal B at the same time as the rise of the control signal A14 for the comparator 2, the stable output signal of the comparator 1 is selected as the output signal D of the multiplexer 3 and applied to the microcomputer 4 as shown in (D) of FIG. 2.

When no data is continuously transmitted in the normal mode of the microcomputer 4, for instance, and the microcomputer 4 need be switched to the standby mode because of no event to be executed, the microcomputer 4 changes the mode switching signal A to the low level at time t2 as shown in (A) of FIG. 2.

The control signal A14 from the AND gate 14 changes to the low level at time t2 as shown in (A14) of FIG. 2. The comparator 2 starts to switch its condition from the inoperative state to the operative state as shown in (C) of FIG. 2. The output signal of the comparator 2 becomes unstable for a moment. The comparator 2 however completes its switching to the operative state within the delay period Td and its output signal level becomes stable.

The delayed signal A12 becomes low after the delay time Td from the fall of the switching signal A as shown in (A12) of FIG. 2. The control signal A13 from the OR gate 13 falls at the time of the fall of the delayed signal A12 as shown in (A13) of FIG. 2. The power supply to the comparator 1 is stopped from this fall time and the comparator 1 starts to switch from the operative state to the inoperative state as shown in (B) of FIG. 2. The output signal of the comparator 1 momentarily fluctuates at this transition as indicated with hatching in (B) of FIG. 2.

When the comparator 1 starts to switch to the inoperative state after the delay time Td, the output signal of the comparator 2 is already stable and fixed and the multiplexer 3 selects the terminal C at the same as the fall of the delayed signal A12. As a result, the multiplexer 3 selects the stable output signal of the comparator 2 as its output signal D and applies the same to the microcomputer 4 as shown in (D) of FIG. 2. Thus, the unstable condition of the comparator 1 does not affect the microcomputer 4.

As described above, during the delay time Td from the signal level change of the mode switching signal A at time t1, the comparator 2 is continued to be held in its preceding operative state to provide its stable output signal. Similarly, during the delay time Td from the signal level change of the mode switching signal A at time t2, the comparator 1 is continued to be held in its preceding operative state to provide its stable output signal.

Thus, the operation switching circuit 11 controls switching timings of the comparators 1 and 2 so that one of the comparators 1 and 2 is already stable when the other is momentarily unstable due to switching transition. The operation switching circuit 11 further controls the multiplexer 3 to select the output signal of one of the comparators 1 and 2, which is stable. As a result, the microcomputer 4 is protected from operating erroneously due to application of the unstable comparator output signal.

Since the comparator 2 is a low power consumption type to operate in the standby mode, only a small current flows in its internal circuit. Therefore, it takes more time for its output signal to become stable at the time of switching operation states than the comparator 1 provided to operate in the normal mode. That is, the output signal of the comparator 2 becomes stable later than that of the comparator 1. If the comparators 1 and 2 are switched over at the same time, a period of production of unstable signals tends to become longer. The switching circuit 15 overcomes this drawback as described above.

(Second Embodiment)

Figure 3:
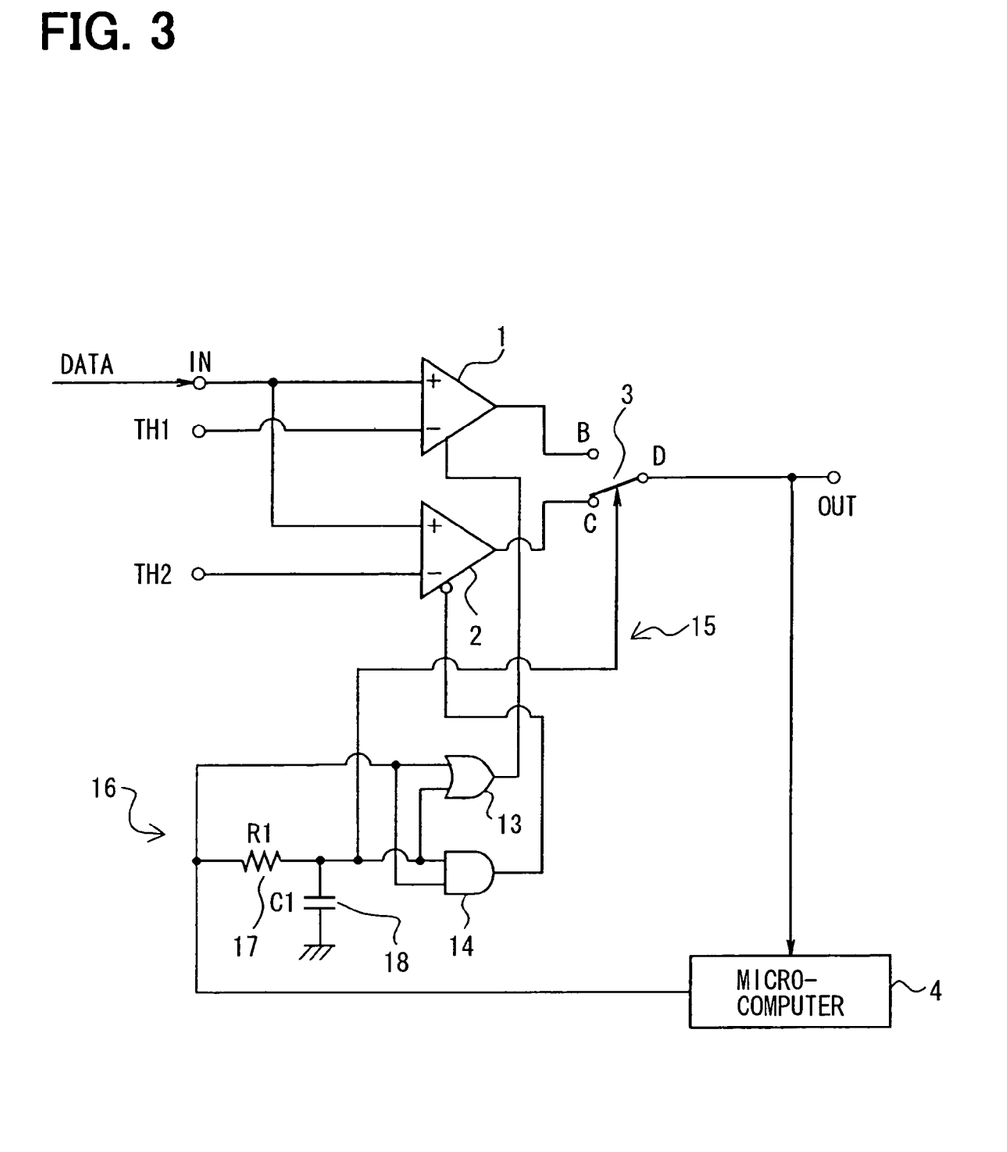
FIG. 3 is a circuit diagram of a comparator switching apparatus according to a second embodiment of the present invention.

In the second embodiment, as shown in FIG. 3, an integration circuit 16 is used to provide the delay time Td. The integration circuit 16 includes a resistor 17 and a capacitor 18. The delay time is determined by a resistance R1 of the resistor 17 and a capacitance of the capacitor 18.

(Third Embodiment)

Figure 4:
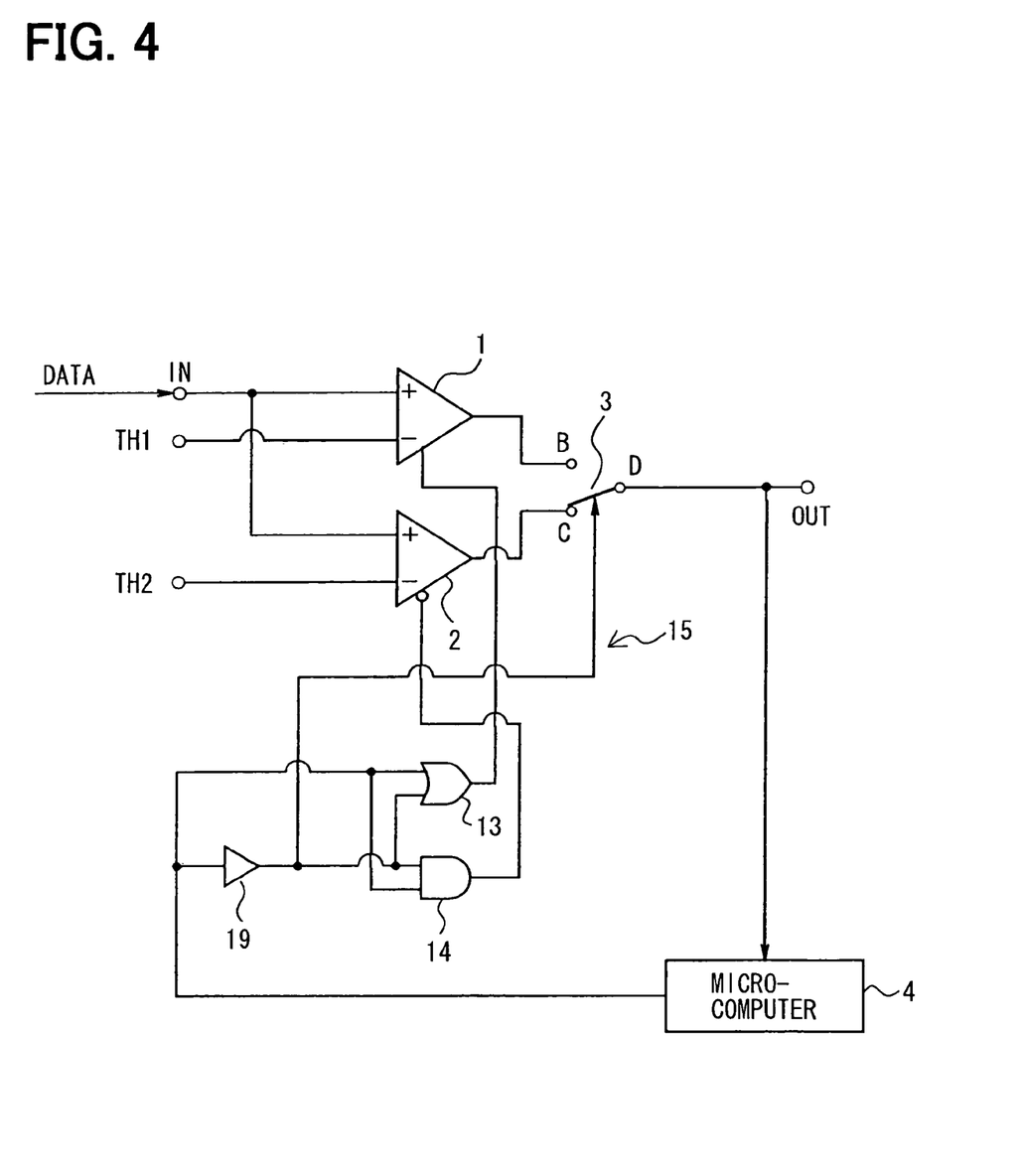
FIG. 4 is a circuit diagram of a comparator switching apparatus according to a third embodiment of the present invention.

In the second embodiment, as shown in FIG. 4, a voltage buffer 19 is used to provide the delay time Td. The delay time is determined by a signal propagation delay time of the buffer 19.

(Fourth Embodiment)

Figure 5:
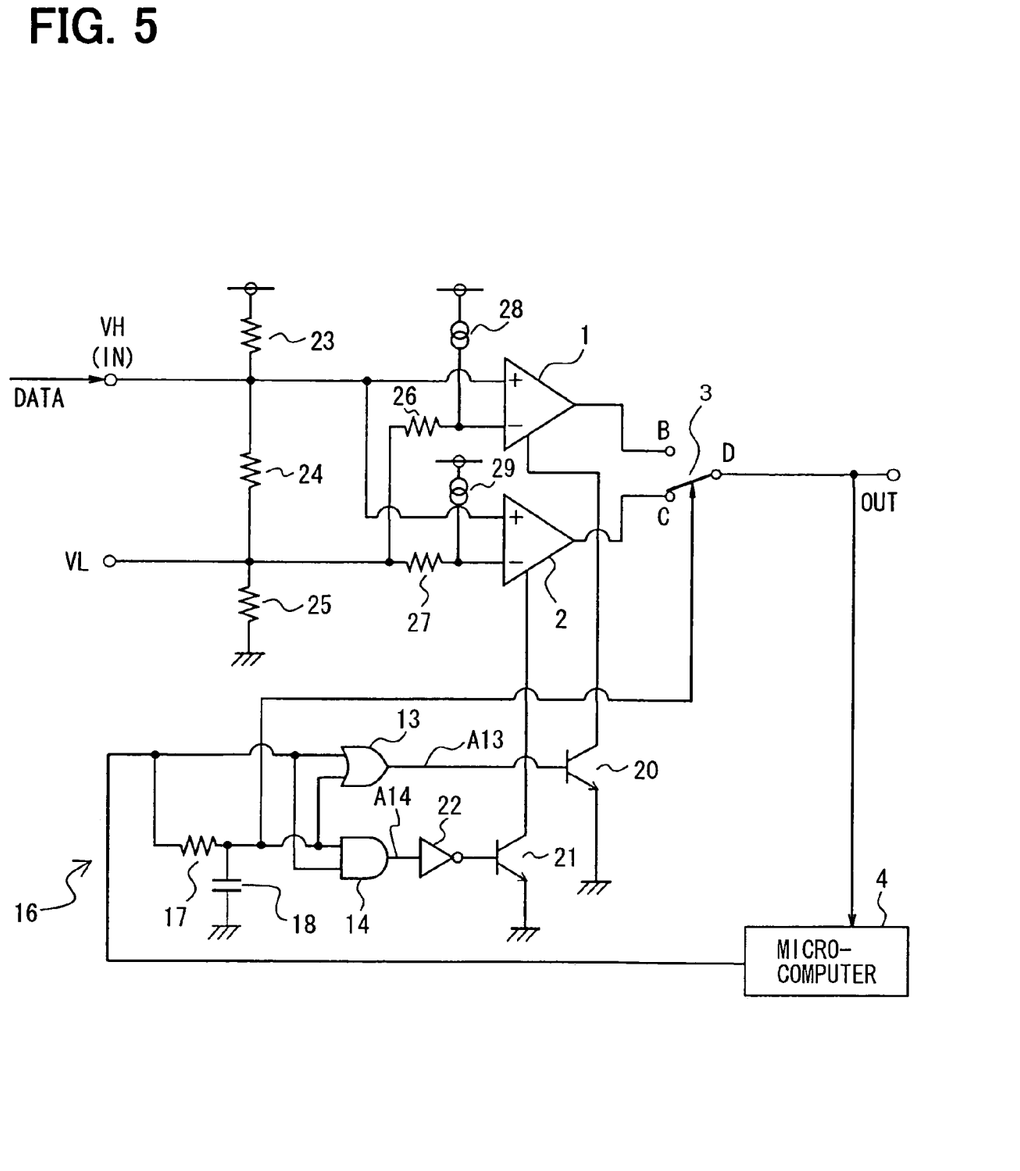
FIG. 5 is a circuit diagram of a comparator switching apparatus according to a fourth embodiment of the present invention.

In the fourth embodiment, as shown in FIG. 5, the delay time Td is provided by the integration circuit 16 in the same manner as the second embodiment (FIG. 3).

In addition, NPN transistors 20 and 21 are connected to the grounding terminals of the comparators 1 and 2 and the ground, respectively. The OR gate 13 is connected to the base of the transistor 20, and the AND gate 14 is connected to the base of the transistor 21 through a NOT gate 22.

A series circuit of resistors 23, 24 and 25 is connected between a power source and the ground. A junction VH between the resistors 23 and 24 is connected to both non-inverting terminals of the comparators 1 and 2. The input data is applied to the junction VH. A junction VL between the resistors 24 and 25 is connected to the inverting input terminals of the comparators 1 and 2 through resistors 26 and 27, respectively. The resistors 26 and 27 have equal resistance. Current sources 28 and 29 are connected to the inverting input terminals of the comparators 1 and 2, respectively. The current sources 28 and 29 are constructed to supply equal current.

In operation, when the control signal A13 produced from the OR gate 13 becomes high, the transistor 20 turns on and connects the grounding terminal of the comparator 1 to the ground to thereby switch the comparator 1 to the operative state. When the control signal A14 produced from the AND gate 14 becomes low, this control signal A14 is inverted by the NOT gate 22 to turn on the transistor 21. The grounding terminal of the comparator 2 is thus connected to the ground to thereby switch the comparator 2 to the operative state.

The thresholds applied to the inverting input terminals of the comparators 1 and 2 are set to the equal levels. The voltage at the input terminal IN (VH) is set to the ground level when no communication data is applied. When communication data is applied to the input terminal IN, the voltage level at the junction VH becomes higher than that at the junction VL. As a result, the comparator 1 or 2, which is in the operative state, produces the high level output signal.

In the fourth embodiment, each of the comparators 1 and 2 may be switched over between the operative state and the inoperative state by PNP transistors (not shown) provided at the power supply sides of the comparators 1 and 2 in place of the NPN transistors 20 and 21 provided at the ground side.

(Modification)

The present invention is not limited to the above embodiments, but may be modified in many other ways.

For instance, two comparators need not be switched over between the standby mode (low power consumption mode) and the normal mode of the microcomputer, but may be used and switched over between other different modes of a circuit other than the microcomputer.

What is claimed is:

1. A comparator switching apparatus for a plurality of comparators that have respective operation characteristics different from one another in respect of a plurality of operation modes and attain respective comparison operations on a same input signal, the comparator switching apparatus comprising:

an operation switching circuit for selectively switching one of the comparators to an operative state in response to a change in a mode switching signal applied from an external side, the one of the comparators being corresponding to a selected operation mode; and a multiplexer for selecting an output signal of the one of the comparators in correspondence to the change in the mode switching signal, wherein the operation switching circuit includes a delay means for delaying the mode switching signal, logic-combines the mode switching signal and a delayed mode switching signal to a logic signal, and switches over the comparators, by using the logic signal, within a period in which at least one of the comparators is in the operative state, and wherein the multiplexer is driven to change a selection operation thereof in response to the delayed mode switching signal.

2. The comparator switching apparatus as in claim 1, wherein the operation switching circuit produces an OR-logic signal of the mode switching signal and the delayed mode switching signal and an AND-logic signal of the mode switching signal and the delayed mode switching signal.

3. The comparator switching apparatus as in claim 1, wherein:

the selected operation mode is a low power consumption mode; and the one of the comparators is constructed to consume less power than other of the comparators.

4. The comparator switching apparatus as in claim 3, wherein:

the comparators attain the comparison operations on a communication data received as the same input signal, and produce respective output signals to be selected by the multiplexer and applied to a microcomputer; and the microcomputer switches over to a normal operation mode from the low power consumption mode when the microcomputer receives the output signal indicative of a reception of the communication data in the low power consumption mode, and applies the mode switching signal to the operation switching circuit and the multiplexer.

5. A comparator switching method for switching over first and second comparators in accordance with a normal mode and a standby mode of a microcomputer, the comparators having respective operation characteristics different from each other in respect of the normal mode and the standby mode, the comparator switching method comprising:

generating a mode switching signal from the microcomputer at a time of switching between the normal mode and the standby mode;

delaying the mode switching signal for a predetermined period longer than periods in which the first comparator and the second comparator operate unstably between an inoperative state and an operative state;

starting to switch the first comparator from the inoperative state to the operative state in response to the mode switching signal;

starting to switch the second comparator from the operative state to the inoperative state in response to a delayed signal of the mode switching signal; and applying a first output signal of the first comparator to the microcomputer only after the predetermined period after continuing to apply a second output signal of the second comparator to the microcomputer for the predetermined period.

* * * * *